United States Patent
Drost et al.

(10) Patent No.: US 6,753,726 B1
(45) Date of Patent: Jun. 22, 2004

(54) APPARATUS AND METHOD FOR AN OFFSET-CORRECTING SENSE AMPLIFIER

(75) Inventors: Robert J. Drost, Mountain View, CA (US); Ivan E. Sutherland, Santa Monica, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/356,450

(22) Filed: Jan. 31, 2003

(51) Int. Cl.[7] .................................................. G06G 7/12
(52) U.S. Cl. ........................ 327/560; 327/51; 330/271
(58) Field of Search ........................ 327/51, 437, 560, 327/561; 330/271, 296; 331/406, 116 FE, 158

(56) References Cited

U.S. PATENT DOCUMENTS

| | | | | |
|---|---|---|---|---|
| 4,177,428 A | * | 12/1979 | Klank | ........................ 455/143 |
| 5,721,516 A | * | 2/1998 | Furuchi | ................ 331/116 FE |
| 6,384,620 B1 | * | 5/2002 | Yamada et al. | ................ 326/29 |

FOREIGN PATENT DOCUMENTS

JP            408181924 A   * 12/1994

* cited by examiner

*Primary Examiner*—Dinh Le
(74) *Attorney, Agent, or Firm*—Martine & Penilla, LLP (57) ABSTRACT

An apparatus and method for a sensing circuit for cancelling an offset voltage. Specifically, in one embodiment, a CMOS inverter amplifier amplifies an input signal present at an input node. A resistive feedback circuit is coupled to the CMOS inverter amplifier for cancelling an offset voltage that is associated with the CMOS inverter amplifier. This is accomplished by biasing the CMOS inverter amplifier to its threshold voltage. A bias circuit is coupled to the resistive feedback circuit for biasing MOSFET transistors in the resistive feedback circuit at a subthreshold conduction region. As such, the resistive feedback circuit presents a high impedance to the input node. A clamping circuit, coupled to the resistive feedback circuit, maintains operation of the transistors in the resistive feedback circuit in the subthreshold conduction region.

33 Claims, 8 Drawing Sheets

APPARATUS AND METHOD FOR AN OFFSET-CORRECTING SENSE AMPLIFIER

BACKGROUND OF THE INVENTION

1. Field of the Invention

Embodiments of the present invention relate to sensing circuits. More particularly, embodiments of the present invention relate generally to a sensing circuit that is capable of correcting for offset voltage associated with a Metal Oxide Semiconductor Field Effect Transistor (MOSFET) amplifier.

2. Related Art

Amplification of extremely weak input signals is one circuit approach for sensing an input signal. In particular, the sensing circuit can utilize amplifiers comprised of metal oxide semiconductor field effect transistors (MOSFETs) for amplification purposes. Standard configurations implementing complementary-symmetry MOSFET (CMOS) circuits may utilize two or more enhancement-type MOSFETs (e.g., a p-channel MOSFET (PMOS) device and an n-channel MOSFET (NMOS) device) for amplification having linear input-output characteristics.

A particular problem inherent with the use of MOSFET amplifiers is the offset voltage. More specifically, an amplifier configuration produces an amplified signal at its output node that is centered on the threshold voltage of the amplifier. The effect of the offset voltage can be visualized as a direct current (DC) voltage across the device that is not zero when current is not flowing through the amplifier.

The offset voltage due to local threshold voltage and current factor mismatches between the NMOS and the PMOS in the amplifier can result in lower resolution in a sensing circuit that utilizes the amplifier. A further problem is that any offset voltage is amplified by the gain of the amplifier. For example, an offset voltage of 40–50 millivolts in the amplifier can reduce the resolution of the sensing-circuit, such that an input signal of less than 40–50 millivolts is detected incorrectly by the sensing circuit.

One solution cancels the offset voltage through a feedback circuit configuration. In one implementation, the feedback circuit can be represented as a resistive feedback circuit. Associated with the feedback circuit is a parasitic capacitance. The parasitic capacitance in conjunction with Miller capacitive effects combine to reduce the strength of the input signal by a factor of 10 or greater.

In order to operate at the lower frequencies, it is necessary to increase the feedback resistance in the resistive feedback circuit. Prior art solutions implement a long channel MOSFET device or a long polysilicon line in the feedback resistive circuit to increase the feedback resistance. Unfortunately, these prior art approaches also increase the total capacitance associated with the resistive feedback circuit. As a result, the attenuation of the input signals due to the capacitive effects brings the input signal below the range of sensitivity for the sensing circuit, such that, the sensing circuit cannot detect the attenuated input signal.

SUMMARY OF THE INVENTION

Accordingly, various embodiments of the present invention disclose an apparatus and method for a sensing circuit that is capable of cancelling offset voltage. Embodiments of the present invention are able to operate at frequencies below 20 MHz in part because the circuit exhibits high resistivity and low capacitance.

Specifically, embodiments of the present invention describe an apparatus and method for a sensing circuit comprising a resistive feedback circuit for cancelling an offset voltage. In one embodiment, a CMOS inverter amplifier may be used to amplify an input signal present at an input node. The input signal may be an extremely weak signal, such as a 3.3 volt clock signal capacitively coupled through as little as 0.1 fF of capacitance, in one embodiment.

According to one exemplary embodiment, a resistive feedback circuit is coupled to the CMOS inverter amplifier for cancelling an input offset voltage that is associated with the CMOS inverter amplifier. The input offset voltage is partly due to NMOS and PMOS transistor mismatches in the CMOS inverter amplifier. The resistive feedback circuit cancels the input offset voltage by biasing the CMOS inverter amplifier to its threshold voltage. A bias circuit is coupled to the resistive feedback circuit for biasing MOSFET transistors in the resistive feedback circuit at a sub-threshold conduction region. When operating in this region, the resistive feedback circuit presents a high impedance to the input node, thereby allowing operation of the sensing circuit at the lower frequencies below 20 MHz, in one embodiment.

A clamping circuit, coupled to the resistive feedback circuit, maintains operation of the transistors in the resistive feedback circuit within the subthreshold conduction region. In one embodiment, the clamping circuit operates only during the larger input voltages. With the clamping circuit, the larger input voltages would first turn on the MOSFET transistors in the clamping circuit before the MOSFET transistors in the resistive feedback circuit. As a result, the resistive feedback circuit maintains its high impedance to allow for amplification of signals at the lower frequencies below 20 MHz.

In addition, by operating MOSFETs in the resistive feedback circuit continuously in subthreshold conduction region, the high impedance of the resistive feedback circuit is accomplished without increasing the capacitance of the resistive feedback circuit. As a result, the resolution of the sensing circuit is increased because capacitive effects that attenuate the input signal are reduced.

DETAILED DESCRIPTION OF THE INVENTION

Reference will now be made in detail to the preferred embodiments of the present invention, a sensing circuit that is capable of canceling offset voltage of an amplifier contained within the sensing circuit, and a method for canceling the offset voltage of an amplifier, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
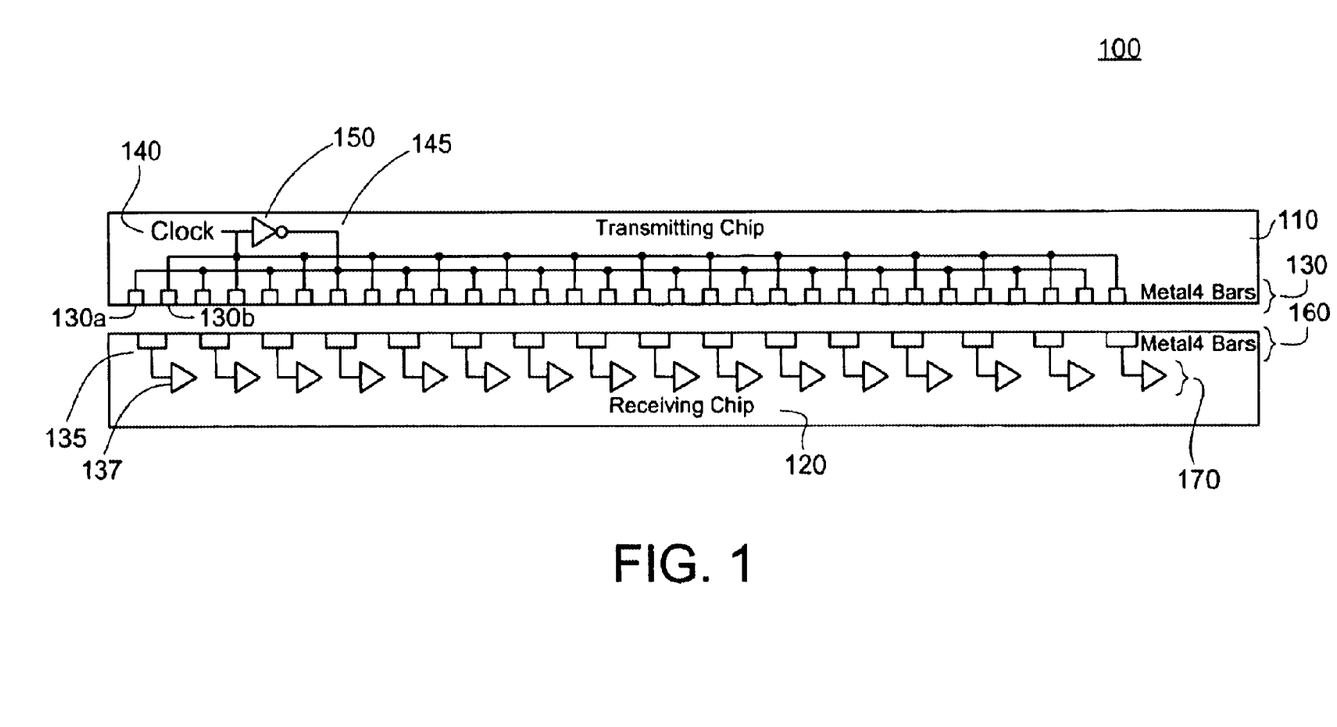
FIG. 1 is a cross-sectional structural diagram of a vernier structure utilizing the sensing circuit capable of canceling offset voltages, and used for measuring relative positions of two chips at a lower frequency below 20 MHz, in accordance with one embodiment of the present invention.

FIG. 1 is a structural diagram illustrating the cross section of a vernier alignment structure 100, in accordance with one embodiment of the present invention. The vernier alignment structure 100 is used to measure relative positions of two integrated circuits (chips) that are located in close proximity to each other. The vernier alignment structure 100 of FIG. 1 measures the alignment between the transmitting chip 110 and the receiving chip 120.

The transmitter chip 110 produces complementary clock waveforms in an alternating pattern over a series 130 of transmitter pads or bars. The complementary clock waveforms originate from clock signal 140. The clock signal 140 is also coupled to an inverter 150 to provide the complementary clock waveforms (clock bar 145). For example, transmitter pad 130A is coupled to the clock bar signal through the inverter 150. Transmitter pad 130B is coupled directly to the clock signal 140.

The receiver chip 120 contains a series 160 of receiver pads or bars over a similar distance as the series 130 of transmitter pads. Each of the series 160 of receiver pads is associated with a series 170 of input amplifiers. Specifically, each of the receiver pads in the series 160 is coupled to an input amplifier in the series 170 of input amplifiers. For example, the receiver pad 135 is associated with the input amplifier 137. As such, the transmitter chip 110 actively drives the complementary clock waveforms to be received by a receiver chip 120 through capacitive coupling.

The series 160 of pads in the receiver chip 120 number one more or less than that provided in the series 130 of pads in the transmitter chip 110. As such, some input amplifiers will correspond to a single pad in the series 130 of pads in the transmitting chip 110, while other input amplifiers will correspond to two pads in the series 130 of pads in the transmitting chip 110. For example, the receiver pad 135 is closest to and associated with the transmitter pads 130A and 130B.

In one embodiment, each of the series 130 of transmitter pads in the transmitter chip 110 is located along a first line at a spatial pitch of variable x. Each of the series 160 of receiver pads is located along a second line at a spatial pitch of variable y. The first line is in parallel with the second line, but separated by a distance. In the vernier structure, the pattern of transmitter pads and receiver pads repeat at a spatial pitch of variable x multiplied by y.

Also, at least one of the series 160 of receiving pads in the receiver chip 120 will flip its state once a change in the distance between the transmitter chip 110 and the receiver chip 120 exceeds a difference distance of (x–y). In this case, the at least one of the series 160 of receiving pads originally was close to a transmitter pad of a certain state, but is now closer to an adjoining transmitter pad of a complementary and opposite state.

In one embodiment, the expected input signal to the input amplifier 137 is a square wave with an approximately fifty percent (50%) duty cycle. The amplitude and polarity of the output waveforms depend on the alignment of the transmitter pads in the series 130 and the receiver pads in the series 160.

In another embodiment, the receiver metal pads in the series 160 each have approximately 10 fF of parasitic capacitance. The parasitic capacitance approximately terminates 7 fF to ground on the receiver chip 120, and 3 fF is terminated to the transmitter pads on the transmitter chip 110. The transmitter chip 110 uses pairs of metal bars on 11 $\mu$m or 13 $\mu$m centers. The receiver chip 120 uses metal bars on 12 $\mu$m centers. As such, a minimum distance change on the order of 1 $\mu$m can be recognized by the vernier alignment structure 100.

To resolve the minimum distance change, the input amplifier of the series 170 detects input clock signals coupled by capacitance differences on the order of one-twenty-fourth (1/24) of the 3 fF total coupling capacitance (e.g., 1.56 fF coupling to clock signal 140, and 1.44 fF coupling to the clock bar signal 145).

The transmitter chip 110 drives the clock signal 140 and the clock bar signal 145 to an equal number of receiver pads in the series 160. As a result, there will almost be zero net current between the transmitter chip 110 and the receiver chip 120.

Figure 2:
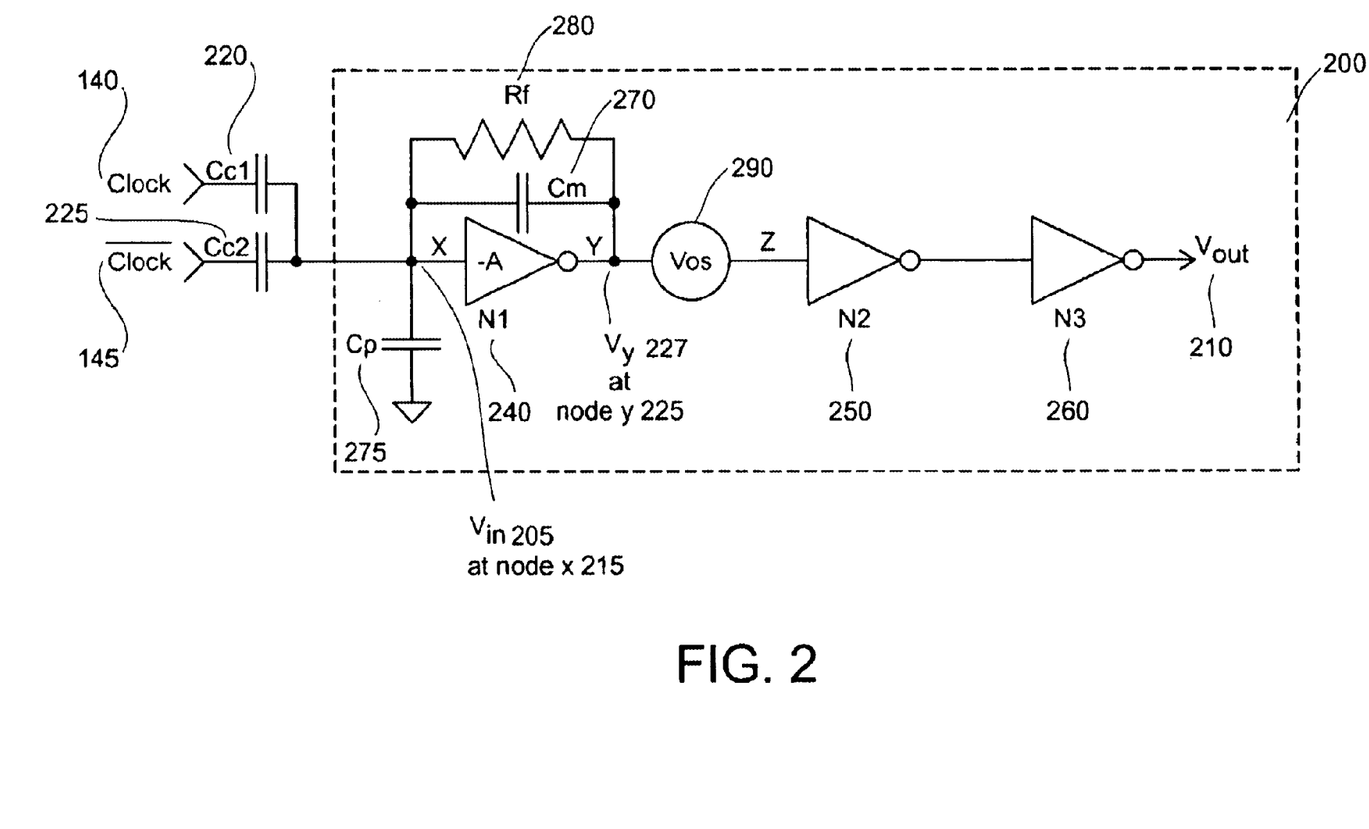
FIG. 2 is a linear model of the sensing circuit illustrating the resistive feedback circuit for canceling offset voltages, in accordance with one embodiment of the present invention.

FIG. 2 is a diagram of the sensing circuit illustrating a resistive feedback circuit for canceling offset voltages, in accordance with one embodiment of the present invention. For purposes of illustration only, the input amplifier block 200 of FIG. 2 is a linear model of the amplifier 137 of FIG. 1.

In FIG. 2, the clock signal 140 and the clock bar signal 145 are shown coupled to the amplifier block 200 through coupling capacitances Cc1 220 and Cc2 225. The coupling capacitances are external to the amplifier block 200 and represent the coupling capacitances between the transmitter pads (e.g., 130A and 130B) and the receiver pad 135 of FIG.

1. The input amplifier 200 provides a voltage output ($V_{out}$) 210 that corresponds to the differential signal provided by coupling capacitances from the clock and clock bar signals from alternating bars (e.g., 130A and 130B) of the transmitter chip 110. In one embodiment, the $V_{out}$ 210 indicates which of the bars (e.g., 130A and 130B) is closer to the receiver pad 135 and the amplifier 137, represented by the amplifier block 200.

An input signal ($V_{in}$) 205 is presented at the X node 215. The inverter amplifier N1 240 is the first stage of the amplifier block 200. The inverter amplifier N1 240 is comprised of an input that is coupled to node X 215, and an output that is coupled to node Y 225. The voltage $V_{in}$ 205 is presented to the input of inverter amplifier N1 240. A voltage at node Y 225 ($V_y$ 227) is generated by the inverter amplifier N1. The gain, A, of the first stage inverter amplifier N1 is represented as follows: $-A=V_y/V_{in}$. In one embodiment, $V_y$ 227 may swing from ground to the supply voltage $V_{dd}$ 360.

Additionally, the amplifier block 200 has a second stage represented by inverter amplifier N2 250, and a third stage represented by inverter amplifier N3 260.

The inverter amplifier N1 240 is associated with an offset voltage ($V_{os}$) 290 due to local threshold voltage and current factor mismatches between the n-channel (NMOS) metal oxide semiconductor field effect transistor (MOSFET) and the p-channel MOSFET (PMOS) in the first stage inverter amplifier N1 240. This transistor mismatch between the NMOS and the PMOS causes a shift in the threshold voltage of the inverter amplifier N1 240.

The resistor $R_f$ 280 is coupled to the input at node X 215 and the output at node Y 225 and comprises a resistive feedback. Transistor mismatch causes shifts in the threshold voltages of inverter amplifiers N1 240, N2 250, and N3 260. The feedback resistor, $R_f$ 280, feeds back a low pass filtered version of the voltage $V_y$ 227 back to node X 215. At low frequencies, the feedback resistor $R_f$ 280 biases $V_{in}$ 205 to equal $V_y$ 227. If the input signal $V_{in}$ 205 coupled onto node X 215 has a constant average value, then the feedback resistor $R_f$ 280 sets $V_{in}$ 205 at node X 215 to have an average value equal to the threshold voltage of inverter amplifier N1. As a result, $V_{in}$ 205 at node X 215 would have the correct bias voltage for a clock input signal (e.g., clock 140) but would drift for a random data input signal. Thus, the resistive feedback cancels the offset voltage $V_{os}$ 290 of the inverter amplifier N1 240.

Further, $V_{os}$ 290 models the input offset voltage of the second stage inverter amplifier N2 250 compared to the first stage amplifier N1 240. Inverter amplifier N1 240 produces an amplified signal on node Y 225 that is centered on the threshold voltage of inverter amplifier N1 240. However, although inverter amplifier N2 250 is substantially similar in dimension to inverter N1 240 in one embodiment, the threshold voltage of inverter amplifier N2 250 will differ from the threshold voltage of N1 240. The difference in the threshold voltages of inverter amplifiers N1 240 and N2 250 will reduce the effective signal at node Y 225.

To translate the offset voltage $V_{os}$ 290 back to the node X 215, $V_{os}$ is divided by the gain of the first stage inverter amplifier N1 240. The input offset voltage at node X 215 is defined as follows: $V_{input\ offset}=V_{os}/-A$, where A is the gain of the first stage N1 240, as previously defined. To further reduce the effect of the offset voltage $V_{os}$ 290 of the inverter amplifier N1 240, the gain of the inverter amplifier N1 240 is increased. In one embodiment, the gain of the inverter amplifier N1 240 is fifty (50).

The resistor $R_f$ 280 produces a Miller effect, resulting in a Miller parasitic capacitance 270 representing the coupling between the input and the output of the first stage amplifier N1 240. The Miller capacitance 270 is multiplied by the gain of the inverter amplifier N1 240.

Also, a parasitic capacitance 275 is present at node X 215 due to the capacitive effects of the MOSFET transistors in a circuit that make up the resistor $R_f$ 280. Also gate capacitance effects from the MOSFET transistors in the inverter amplifier N1 also contribute to the parasitic capacitance 275 at node X 215. The parasitic capacitance 275 forms a capacitor divider with the coupling capacitances Cc1 220 and Cc2 225, and attenuates the input signal Vin at node X 215. As such; it is necessary to reduce the parasitic capacitance 275 in order to increase the sensitivity of the sensing circuit that includes the amplifier block 200.

If the coupling capacitances, Cc1 220 and Cc2 225 are equal, then the complementary clock signals, clock 140 and clock bar 145 will cancel each other and produce no net input signal at node X 215. On the other hand, if there is a difference between the coupling capacitances, then the actual input signal ($V_{in}$ 205) is given by the clock signal 140 coupling through the difference of Cc1 220 and Cc2 225 (ΔC=Cc1−Cc2). Furthermore, ΔC in series with the combination of the Miller Cm 270 and parasitic capacitances Cp 275 of the receiver chip 120 define the input signal $V_{in}$ 205 as follows:

$$V_{in}=\Delta C/[(C_1+C_2-\Delta C+(Cm)(A)+Cp)][\text{Clock Signal}]$$

To illustrate the sensitivity of the sensing circuit 200, in one embodiment, the sensing circuit 200 is able to detect a differential clock signal, $V_{in}$ 205, that is a 3.3 volt clock signal coupled through a minimum of 0.1 fF differential coupling capacitance having a frequency between 0–20 MHz.

The feedback resistor $R_f$ 280 and the total capacitance on node X 215 form a high pass filter that rejects low frequency input signals. Unfortunately, in some cases the vernier alignment structure of FIG. 1 operates at the lower frequencies below 20 MHz. To prevent the high pass filter in FIG. 2 from rejecting desired clock frequencies, in this case the feedback resistance must be large.

Figure 3:
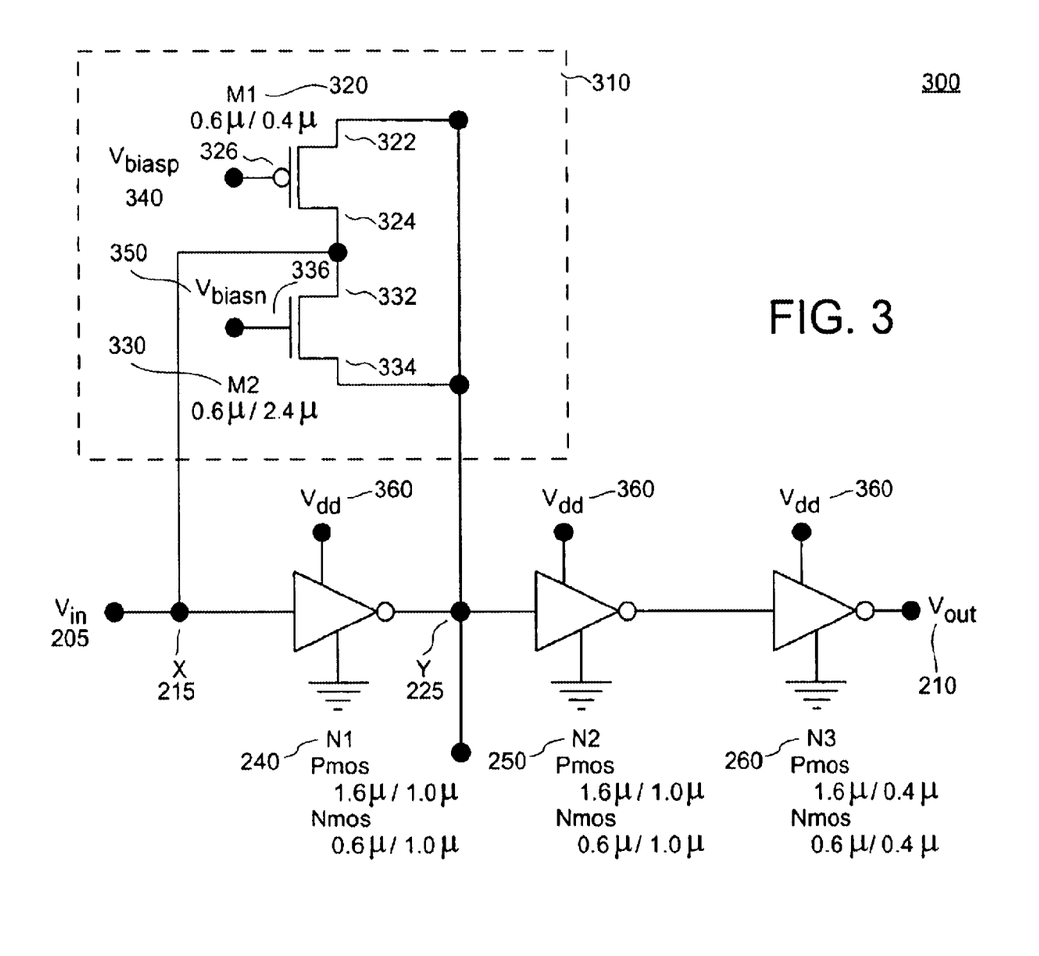
FIG. 3 is a schematic diagram of the sensing circuit in FIG. 2 illustrating the resistive feedback circuit for canceling offset voltage, and capable of operating at the lower frequencies below 20 MHz, in accordance with one embodiment of the present invention.

FIG. 3 is a schematic diagram of a sensing circuit 300 that is the amplifier block 200 of FIG. 2, in accordance with one embodiment of the present invention. The sensing circuit 300 comprises a resistive feedback circuit 310 that presents a high impedance at the input to the inverter amplifier N1 240, and cancels an offset voltage of the inverter amplifier N1 240. As such, the sensing circuit 300 is able to detect input signals $V_{in}$ 205 at node X 215 below 20 MHz. The resistive feedback circuit 310 acts to bias the first stage of the sensing circuit to the threshold voltage ($V_T$) of the inverter amplifier N1 240. As such, the inverter amplifier N1 240 is biased at its high gain point around its threshold voltage ($V_T$). The resistive feedback circuit 310 is represented by the resistor $R_f$ 280 in the linear model of FIG. 2.

The sensing circuit 300 comprises three stages of amplification using three complementary MOSFET (CMOS) inverter amplifiers N1 240, N2 250, and N3 260, in accordance with one embodiment of the present invention. The inverter amplifiers are of standard circuit design. In one implementation, an NMOS and a PMOS coupled together implement the inverter amplifier. A voltage $V_{dd}$ 360 and ground are provided as supply voltages to each of the inverter amplifiers N1 240, N2 250, and N3 260.

The first two stages, N1 240 and N2 250 are matched in device size, layout, current direction and metal coverage. As stated previously, in one embodiment, the gain for each of the stages N1 240 and N2 250 is 50. The dimensions for the inverter amplifier N1 240 and N2 250 in a standard circuit design are as follows: PMOS (1.6 μm/1.0 μm), and NMOS (0.6 μm/1.0 μm). For purposes of standardization, dimensions for MOSFETs are given in a width/length format.

Figure 4:
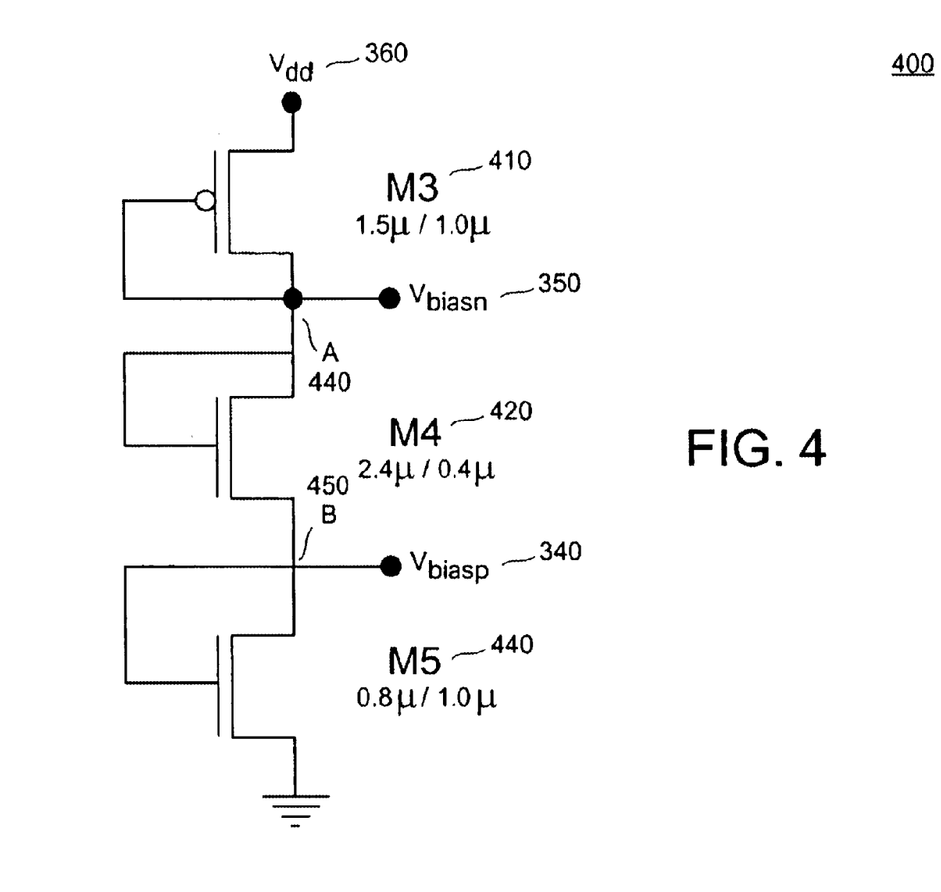
FIG. 4 is a schematic diagram of a biasing circuit that is coupled to the resistive feedback circuit of FIG. 3 for maintaining MOSFET transistors of the resistive feedback circuit at a subthreshold conduction region, such that the resistive feedback circuit has a high impedance, in accordance with one embodiment of the present invention.
Figure 5:
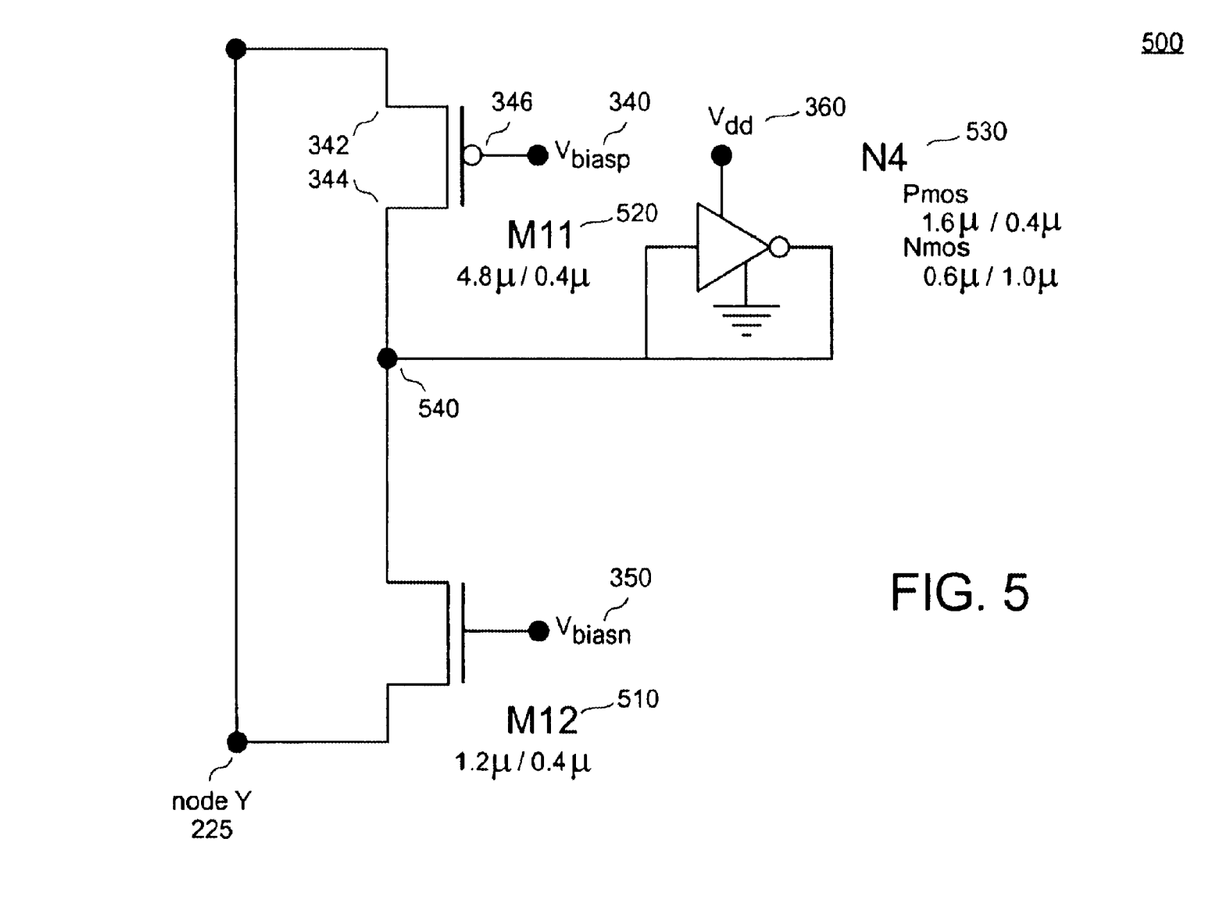
FIG. 5 is a schematic diagram of a clamping circuit that is coupled to the resistive feedback circuit of FIG. 3 for maintaining the MOSFET transistors of the resistive feedback circuit at a subthreshold conduction region for larger swing input voltages, in accordance with one embodiment of the present invention.

The dimensions for the inverter amplifiers N1 240, N2 250, and N3 260, as well as the MOSFET transistors in FIGS. 4 and 5 are provided for illustration purposes only. Other embodiments implementing other dimensions for the MOSFET transistors and the inverter amplifiers are suitable for achieving offset cancellation of the inverter amplifier N1 240 for $V_{in}$ 205 frequencies below 20 MHz.

A third stage of amplification is optionally provided to increase the sensitivity and range of the sensing circuit 300. The dimensions for the inverter amplifier N3 are as follows: PMOS (1.6 μm/0.4 μm) and NMOS (0.6 μm/0.4 μm). Additionally, the third stage inverter amplifier N3 260 achieves a full swing digital output voltage for small clock swings below 1 mV. In one embodiment, the gain for the third stage of amplification through N3 260 is at least 10.

The resistive feedback circuit 310 is comprised of PMOS and NMOS transistors. The resistive feedback circuit 310 biases the CMOS inverter amplifier N1 240 to a threshold voltage associated with N1 240 in order to cancel the offset voltage also associated with N1 240. Additionally, in digital CMOS technology, a weakly conducting MOSFET can act as a large resistor. This would allow for the resistive feedback circuit 310 to operate at the lower clock frequencies (e.g., less than 20 MHz).

The PMOS transistor M1 320 in the resistive feedback circuit 310 comprises an M1 source 322 that is coupled to node Y 225, and an M1 drain 324 that is coupled to node X 215. An M1 gate 326 is coupled to a bias voltage $V_{biasp}$ 340 in order to maintain M1 320 in the subthreshold conduction region. In other words, the PMOS M1 320 is barely conducting, as the M1 gate to M1 drain voltage is just below the threshold voltage of M1 320.

The NMOS transistor M2 330 in the resistive feedback circuit comprises an M2 drain 332 coupled to node X 215, and an M2 source 334 that is coupled to node Y 225. An M2 gate 336 is coupled to a bias voltage $V_{biasn}$ 350 in order to maintain M2 330 in the subthreshold conduction region. As for the PMOS M1 320, the NMOS M2 330 is barely conducting, as the M2 gate to M2 drain voltage is just below the threshold voltage of M2 330.

FIG. 4 is a schematic diagram of a bias circuit 400 that is coupled to the resistive feedback circuit 310 of FIG. 3, in accordance with one embodiment of the present invention. The bias circuit 400 mimics the inverter amplifier N1 240, and adds a series connected NMOS diode M4 420 to provide the necessary bias voltages for placing the MOSFETs in the resistive feedback circuit 310 in the bias regions of subthreshold conduction. This, in turn creates a high impedance for the resistive feedback circuit 310 as seen at node X 215.

In one embodiment, the bias circuit 400 is comprised of a PMOS transistor M3 410 that is coupled to an NMOS diode M4 420, and an NMOS transistor M5 430. The PMOS M3 410 comprises an M3 source coupled to the supply voltage $V_{dd}$ 360, and an M3 gate coupled to an M3 drain at node A 440. The node A 440 provides a bias voltage $V_{biasn}$ 350.

The PMOS M3 410 may be designed to be slightly shorter than the PMOS located in the inverter amplifier N1 240. This allows $V_{biasn}$ to be shifted slightly below the threshold voltage $V_T$ of the inverter amplifier N1 240. The dimensions of M3 410 are 1.5 μm/1.0 μm. In this case the length of M3 410 is slightly smaller than the length of the PMOS in the inverter amplifier N1 240.

In one embodiment, the bias circuit 400 is comprised of an NMOS transistor M5 430 that comprises an MS source coupled to ground, and an MS gate that is coupled to an MS drain at node B 450. The node B 450 provides a bias voltage $V_{biasp}$ 340.

The NMOS M5 430 may be designed to be slightly wider than the NMOS located in the inverter amplifier N1 240. This allows $V_{biasp}$ to be shifted slightly above the threshold voltage $V_T$ of N1 240. The dimensions of MS are 0.8 μm/1.0 μm. in this case the width of MS 430 is slightly larger than the width of the NMOS in the inverter amplifier N1 240.

An NMOS diode 420 is provided to set the two bias voltages $V_{biasn}$ 350 and $V_{biasp}$ 340. The dimensions of M4 420 are 2.4 μm/0.4 μm. With the NMOS diode M4 420, the bias voltage $V_{biasn}$ 350 is set approximately 500 mV above the threshold voltage $V_T$ of N1 240. Also, the NMOS diode M4 420 sets the bias voltage $V_{biasp}$ 340 to approximately 500 mV below $V_T$. This is essential to maintain the MOSFET transistors in the resistive feedback circuit 310 in the subthreshold conduction region of operation.

Figure 7:
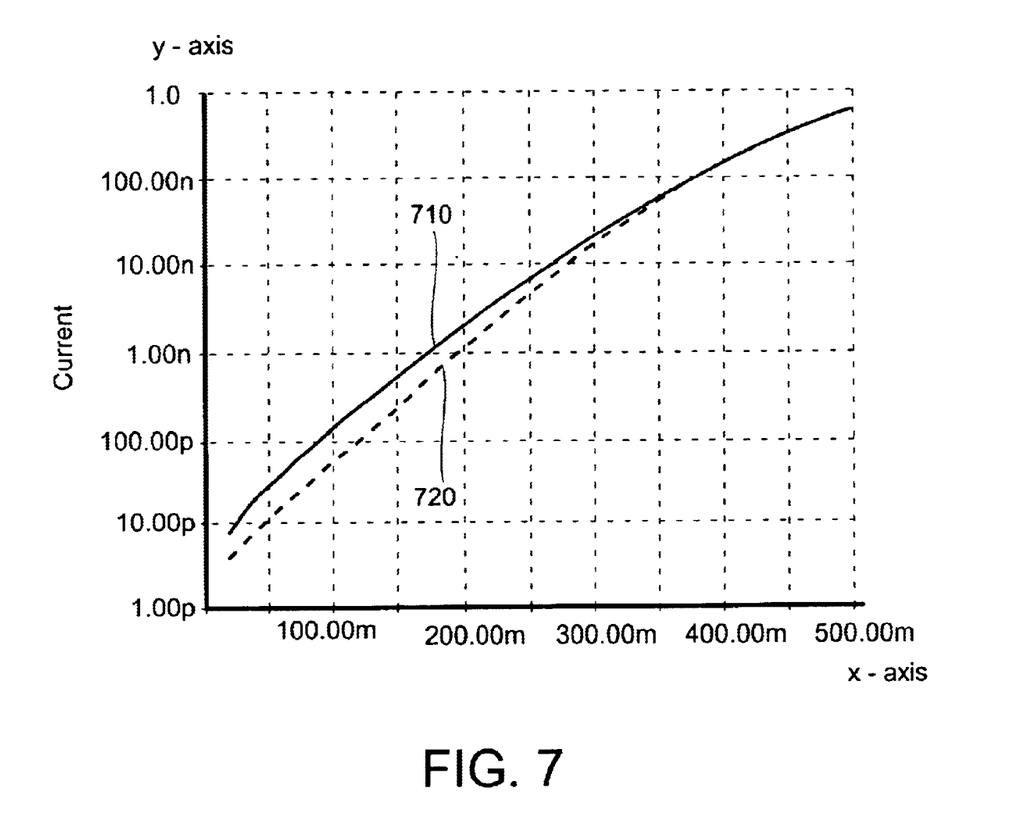
FIG. 7 is a log-scale vs. current plot diagram illustrating the approximate straight line characteristics for operation of an exemplary embodiment of the resistive feedback circuit in the subthreshold conduction region, in accordance with one embodiment of the present invention.

FIG. 7 is a plot diagram illustrating the log scale current plot for the resistive feedback circuit 310 of FIG. 3. To overlay the feedback currents from NMOS M2 330 and the PMOS M1 320, the x-axis varies the voltage $V_y$ 227 on node Y 225 positively for the feedback current from the PMOS M1 320, and negatively for the feedback current from the NMOS M2 330. Line 710 illustrates the feedback current for the PMOS M1 320, and line 720 illustrates the feedback current for the NMOS M2 330.

The x-axis illustrates the difference in voltage between the $V_y$ 227 and $V_{in}$ 205, which is essentially the voltage across the resistive feedback circuit 310. The y-axis illustrates the current being conducted through the resistive feedback circuit 310, and is presented in a log scale format. The nearly straight line current increases are characteristic of the subthreshold conduction region of operation. As such, both lines 710 and 720 illustrate that the transistors PMOS M1 320 and NMOS M2 330 are operating in the subthreshold conduction region of operation.

FIG. 5 is a schematic diagram of a clamping circuit 500 that reduces the swing extremities produced by the input inverter amplifier N1 240. Without the clamping circuit 500, the inverter amplifier N1 240 and the sensing circuit 300 would operate incorrectly for large input signals $V_{in}$ 205. Specifically, with larger $V_{in}$ 205, the voltage $V_y$ 227 put out by the inverter amplifier N1 240 would send the MOSFET transistors M1 320 and M2 330 out of the subthreshold conduction region.

In this case, for large input signals $V_{in}$ 205, the gate to drain voltage drop for both M1 320 and M2 330 would be much greater than $V_T$ and would turn both M1 320 and M2 330 on hard. Without the clamping circuit 500, the total resistance presented at node X 215 would be greatly reduced since M1 320 and M2 330 are fully conducting, thereby rendering low frequency operation of the first stage inverter amplifier 240 inoperable.

However, the clamping circuit 500 reduces the first stage inverter amplifier output signal $V_y$ 227, when operational. For small-swing voltages near the threshold voltage $V_T$ of the inverter amplifier N1 240, the clamping circuit 500 is not active. For large-swing voltages, the clamping circuit 500 clamps the output swing of the output voltage signal $V_y$ 227 of the inverter amplifier N1 240. In this way, the MOSFET transistors, M1 320 and M2 330, in the resistive feedback circuit 310 continue to operate in the subthreshold conduction region at the larger swing voltages, thereby maintaining high impedance for the resistive feedback circuit 310. In one embodiment, the clamping circuit 500 reduces the first stage amplifier output signal $V_y$ 227 by approximately thirty-five percent (35%) for a large input signal. For small input signals, the output signal $V_y$ 227 is not reduced.

In one embodiment, the clamping circuit 500 is comprised of a PMOS transistor M11 520 that is coupled to an NMOS transistor M12 510 and an inverter amplifier N4 530. The PMOS M11 520 comprises an M11 source 342 coupled to node Y 225, an M11 gate 346 coupled to $V_{biasp}$ 340, and an M11 drain 344 that is coupled to node C 540. A voltage $V_c$ is provided at node C 540. The NMOS M12 of the clamping circuit 500 comprises an M12 drain coupled to node C 540, an M12 gate coupled to $V_{biasn}$ 350, and an M12 source coupled to node Y 225.

An inverter amplifier N4 530 has an input coupled to node C 540 and an output coupled to node C 540. The inverter amplifier N4 530 is of similar configuration and dimension as inverter amplifier N1 240. In one embodiment, the inverter amplifier N4 comprises a PMOS transistor (width 1.6 μm and length 0.4 μm) and an NMOS transistor (width 0.6 μm and length 1.0 μm).

The dimensions for PMOS M11 520 are a width of 4.8 μm and a length of 0.4 μm, in one embodiment. The dimensions of NMOS M12 510 are a width of 1.2 μm and a length of 0.4 μm, in one embodiment. These dimensions illustrate that PMOS M11 520 is stronger than PMOS M1 320 by approximately eight times, and that NMOS M12 510 is stronger than NMOS M2 330. In one embodiment, the larger width to length (w/l) ratios allow PMOS M11 520 to be eight times as strong in conduction as the PMOS M1 320 at the larger input signals $V_{in}$ 205. Similarly, the NMOS transistor M12 510 has twelve times the strength in conduction as the NMOS transistor M2 330 at the larger input signals $V_{in}$ 205.

As such, at the larger voltage swings of input signals $V_{in}$ 205, the MOSFET transistors M11 520 and M12 510 overcome the operation of the transistors M1 320 and M2 330, and act as a load to control the voltage $V_c$ 550 at node C 540. This in turn controls the voltage $V_y$ 227 at node Y 225 and attenuates the total gain seen from the first stage inverter amplifier N1 240. This allows for the transistors M1 320 and M2 330 to continually operate in the subthreshold conduction region even for larger swings of input voltage $V_{in}$ 205.

Figure 8:
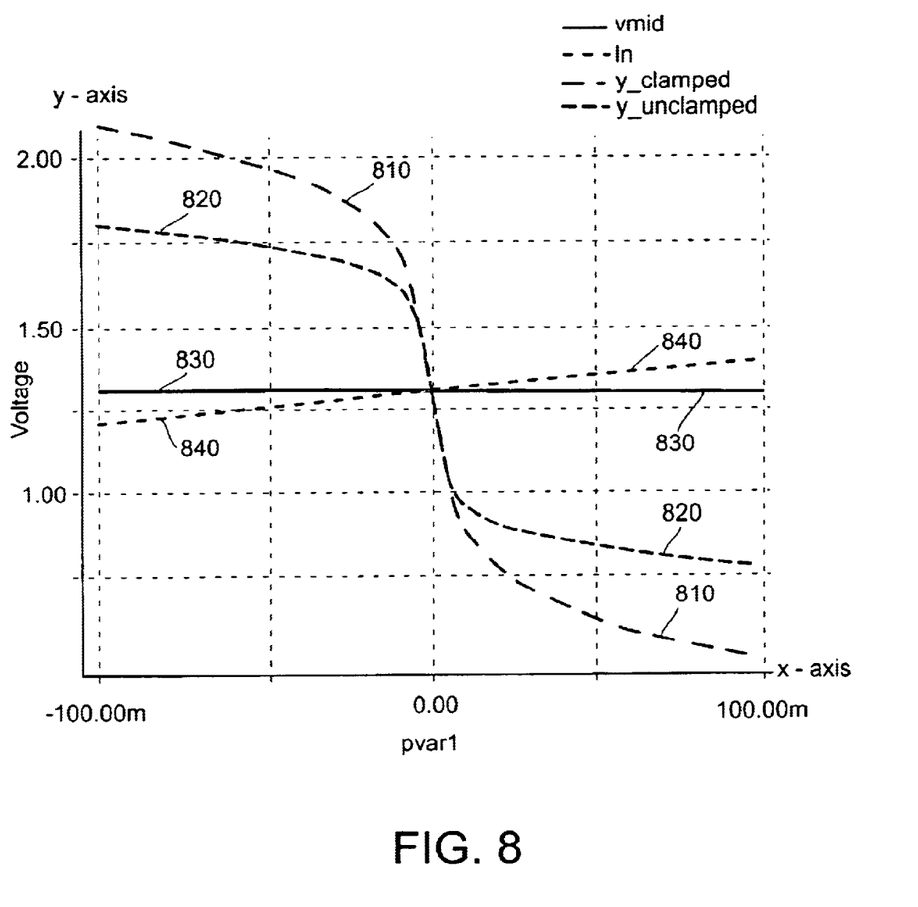
FIG. 8 is a plot diagram illustrating the effect of an exemplary embodiment of the clamping circuit on the DC gain of the first stage of the inverter amplifier of the sensing circuit, in accordance with one embodiment of the present invention.

FIG. 8 is a plot diagram illustrating the DC gain of the first stage of the inverter amplifier N1 240 for clamped and unclamped first stages. The x-axis illustrates the difference in voltage between the input voltage level $V_{in}$ 205 and the threshold voltage ($V_T$) of the inverter amplifier N1 240.

Four voltages are plotted in the y-axis of FIG. 8. Line 830 is the threshold voltage ($V_T$) of the inverter amplifier 240. In one embodiment, $V_T$ is one half of a supply $V_{dd}$ 360 that is supplied to said CMOS inverter amplifier N1 240. Line 840 illustrates the positive and negative voltage swing for $V_{in}$ 205.

Lines 810 and 820 illustrate the effect of the clamping circuit 500 on the voltage $V_y$ 227 at node Y 225. Line 810 illustrates $V_y$ 227 without the clamping circuit, and shows a maximum swing from $V_T$ of approximately +/−0.75 volts. On the other hand, with the clamping circuit 500, the maximum swing of $V_y$ 227 from $V_T$ is reduced to approximately +/−0.5 volts.

Also shown in FIG. 8, the clamping circuit 500 is not active for small-swing voltages near $V_T$, denoted by line 830. However, for larger-swing voltages approximately greater than +/−0.5 volts, the clamping circuit 500 begins to operate, thereby reducing the first stage output signal $V_y$ 227. In one embodiment, the signal $V_y$ is reduced by approximately 35%.

Figure 6:
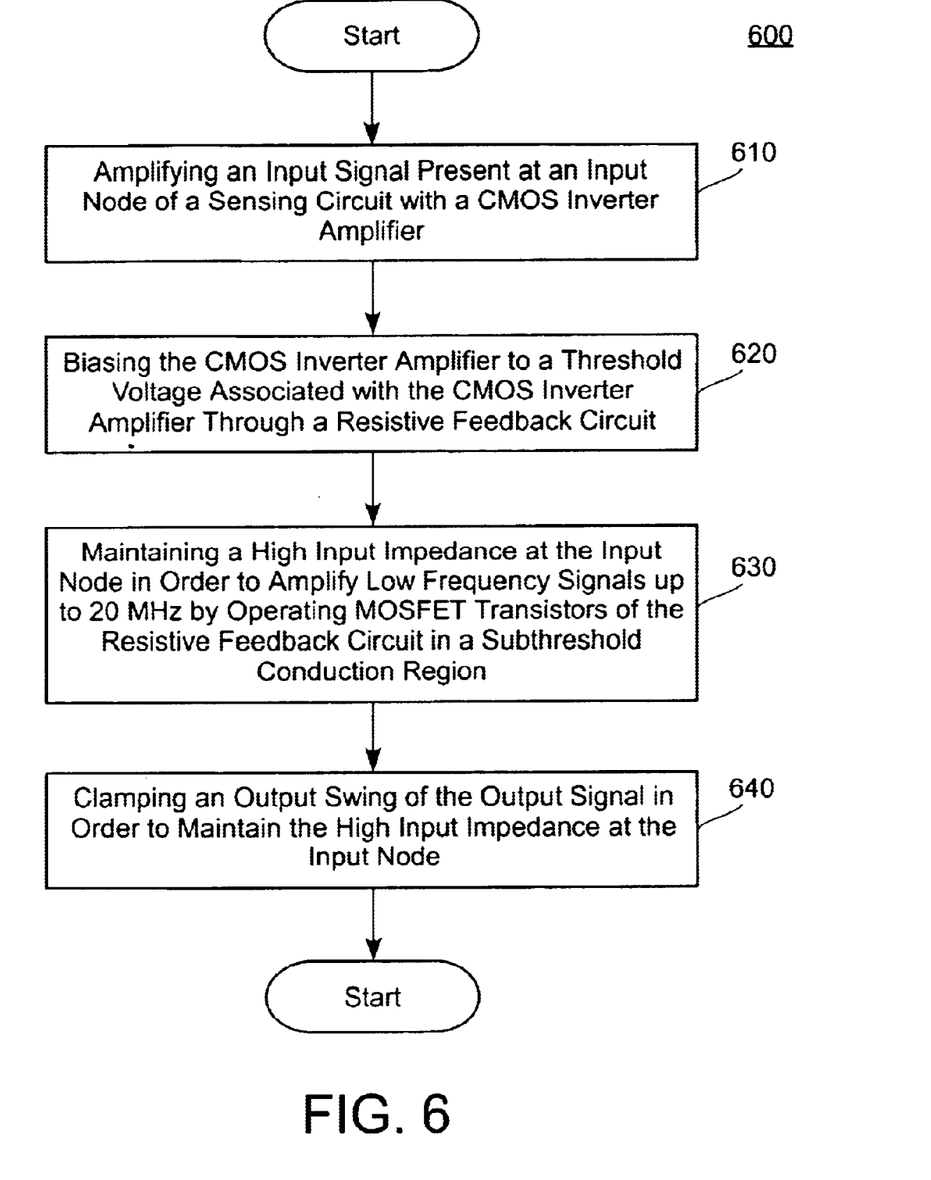
FIG. 6 is a flow chart of steps in a method for canceling offset voltages in a sensing circuit designed to operate at the lower frequencies below 20 MHz, in accordance with one embodiment of the present invention.

FIG. 6 is a flow chart 600 illustrating steps in a method for cancelling offset voltage in a sensing circuit, in accordance with one embodiment of the present invention. The method of flow chart 600 is illustrative of the mechanisms employed by the circuit diagrams of FIGS. 2, 3, 4, and 5 for cancelling an offset voltage of the inverter amplifier N1 240.

The present embodiment begins by amplifying an input signal present at an input node of the sensing circuit with a CMOS inverter amplifier, in step 610. The CMOS inverter amplifier represents a first stage of amplification. The input signal is an extremely weak signal. In one embodiment, the input signal is a differential capacitively coupled signal from a vernier structure for measuring relative distances between two chips.

In step 620, the present embodiment cancels an offset voltage associated with the CMOS inverter amplifier by biasing the CMOS inverter amplifier to a threshold voltage. The threshold voltage is associated with said CMOS inverter amplifier. This is accomplished by feeding an output signal of the CMOS inverter amplifier through a resistive feedback circuit and back to the input node.

In step 630, the present embodiment maintains a high input impedance at the input node in order to amplify low frequency signals up to 20 MHz. The high input impedance presented to the input node is accomplished by operating MOSFET transistors located within the resistive feedback circuit in a subthreshold conduction region. In other words, the MOSFET transistors operate under their threshold voltages, and are barely conducting current through their respective n and p channels.

A bias circuit is provided to bias the voltages in the resistive feedback network such that the MOSFETs in the resistive feedback network continue to operate in the subthreshold conduction region. The bias circuit mimics the CMOS inverter amplifier by closely approximating its transistor sizes and configurations. The bias circuit comprises a PMOS transistor and an NMOS transistor coupled together in a standard CMOS inverter configuration.

An NMOS diode is coupled in series to the PMOS transistor and said NMOS transistor in order to provide a first bias voltage from the PMOS transistor in the bias circuit. The first bias voltage is supplied to the resistive feedback circuit, and is slightly below the threshold voltage of the inverter amplifier. This is accomplished by sizing the PMOS transistor of the bias circuit slightly shorter than a PMOS transistor in the CMOS inverter amplifier.

The NMOS diode also provides a second bias voltage from the NMOS transistor of the bias circuit. The second bias voltage is supplied to the resistive feedback circuit, and is slightly above the threshold voltage of the inverter amplifier. This is accomplished by sizing the NMOS transistor of the bias circuit slightly wider than an NMOS transistor in the CMOS inverter amplifier.

In step 640, the present embodiment clamps an output swing of the output signal provided by the inverter amplifier in order to maintain the high input impedance at the input node. The output swing is restricted by coupling PMOS and NMOS switch transistors to the resistive feedback circuit. The PMOS and NMOS switch transistors are substantially larger than MOSFET transistors in said resistive feedback circuit, and as such, the PMOS and NMOS switch transistors are turned on when the output voltage swings too high.

The present embodiment clamps to a second CMOS inverter amplifier that is substantially similar to the inverter amplifier used in the first stage amplifier of step 610. The second CMOS inverter amplifier and clamp are used for attenuating gain from the CMOS inverter amplifier of the first stage amplifier when the PMOS and NMOS switch transistors are turned on.

The present embodiment also performs a second stage amplification by amplifying the output signal from the first stage with another CMOS inverter amplifier. The CMOS inverter amplifier of the second stage is substantially similar in dimension and configuration to the CMOS inverter amplifier of the first stage.

In addition, the present embodiment optionally performs a third stage of amplification. In the third stage, an output signal from the CMOS inverter amplifier of the second stage is amplified in order to bring the output signal up to a full swing digital output voltage for frequencies below 1 MHz for the input signal.

While the methods of embodiments illustrated in flow chart 600 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, a method and apparatus for cancelling offset voltage in a sensing circuit, are thus described. While the present invention has been described in particular embodiments, it should be appreciated that the present invention should not be construed as limited by such embodiments, but rather construed according to the below claims.

What is claimed is:

1. A sensing circuit comprising:
   a CMOS inverter amplifier coupled to an input node, said CMOS inverter amplifier for amplifying an input signal;
   a resistive feedback circuit coupled to said CMOS inverter amplifier and for cancelling an offset voltage associated with said CMOS inverter amplifier;
   a bias circuit coupled to said resistive feedback circuit and for biasing said resistive feedback circuit in a minimally on state to maintain high impedance for said resistive feedback circuit; and
   a clamping circuit coupled to said resistive feedback circuit for restricting output swing of an output signal of said CMOS inverter amplifier to maintain said high impedance.

2. The sensing circuit as described in claim 1, wherein said input signal is a capacitively coupled differential clock signal from a vernier structure.

3. The sensing circuit as described in claim 2, wherein said differential clock signal is a 3.3 volt clock signal coupled through a minimum of 0.1 fF differential coupling capacitance and having a frequency of between 0–20 MHz.

4. The sensing circuit as described in claim 1, wherein said resistive feedback circuit biases said CMOS inverter amplifier to a threshold voltage associated with said CMOS inverter amplifier to cancel said offset voltage.

5. The sensing circuit as described in claim 1, wherein said resistive feedback circuit comprises:
   a PMOS transistor comprising a PMOS source coupled to an output of said CMOS inverter amplifier that provides said output signal, a PMOS gate, and a PMOS drain coupled to said input node; and
   an NMOS transistor comprising an NMOS drain coupled to said PMOS source, an NMOS gate, and an NMOS source coupled to said output.

6. The sensing circuit as described in claim 1, wherein said bias circuit comprises:
   a second CMOS inverter amplifier of similar dimension to said CMOS inverter amplifier, said second CMOS inverter amplifier comprising a PMOS transistor and an NMOS transistor in a standard inverter configuration; and
   an NMOS diode coupled in series between said PMOS transistor and said NMOS transistor, said NMOS diode for providing a p-bias voltage from said PMOS transistor to said resistive feedback circuit that is slightly lower than a threshold voltage associated with said CMOS inverter amplifier, and an n-bias voltage from said NMOS transistor that is slightly higher than said threshold voltage.

7. The sensing circuit as described in claim 1, wherein said clamp circuit comprises:
   a PMOS transistor comprising a PMOS source coupled to an output of said CMOS inverter amplifier that provides said output signal, a PMOS gate coupled to a first bias voltage slightly lower than a threshold voltage of said CMOS inverter amplifier, and a PMOS drain coupled to a bias node;
   said bias node;
   an NMOS transistor comprising an NMOS drain coupled to bias node, an NMOS gate coupled to a second bias voltage slightly higher than said threshold voltage, and an NMOS source coupled to said output; and
   a second CMOS inverter amplifier of similar dimension to said CMOS inverter amplifier, and comprising a second input coupled to said bias node and a second output coupled to said bias node.

8. The sensing circuit as described in claim 1, wherein said CMOS inverter amplifier is a first amplification stage, and further comprising:
   a second amplification stage comprising a second CMOS inverter amplifier coupled to said output, said second CMOS inverter amplifier of similar dimension and configuration as said CMOS inverter amplifier; and
   a third amplification stage comprising a third CMOS inverter amplifier coupled to said second CMOS inverter amplifier.

9. A low frequency sensing circuit comprising:
   a CMOS inverter amplifier for amplifying an input signal and comprising an output coupled to a mid node, said CMOS inverter amplifier associated with a threshold voltage; and
   a resistive feedback circuit for biasing said CMOS inverter amplifier at said threshold voltage and cancelling an offset voltage associated with said CMOS inverter amplifier, and comprising:
      a PMOS transistor operating in a subthreshold conduction region comprising a PMOS source coupled to said mid node, a PMOS drain coupled to an input node of said CMOS inverter amplifier, and a PMOS gate coupled to a first bias voltage that is slightly below said threshold voltage; and
      an NMOS transistor operating in said subthreshold conduction region comprising an NMOS drain coupled to said input node, an NMOS source coupled to said mid node; and an NMOS gate coupled to a second bias voltage that is slightly above said threshold voltage.

10. The sensing circuit as described in claim 9, wherein said CMOS inverter amplifier comprises:
    a second PMOS transistor; and
    a second NMOS transistor coupled to said second PMOS transistor in a standard CMOS inverter configuration, wherein said CMOS inverter amplifier is coupled to a ground and a supply voltage $V_{dd}$, such that an output signal present at said output swings from ground to said $V_{dd}$.

11. The sensing circuit as described in claim 9, further comprising a bias circuit for biasing said resistive feedback circuit, and comprising:
   a second PMOS transistor comprising a second PMOS source coupled to a supply voltage, a second PMOS gate, and a second PMOS drain coupled to said second PMOS gate, said second PMOS drain providing said second bias voltage;
   an NMOS diode comprising a diode drain coupled to said second PMOS drain, a diode gate coupled to said diode drain, and a diode source; and
   a second NMOS transistor comprising a second NMOS drain coupled to said diode source, a second NMOS gate coupled to said second NMOS drain, and a second NMOS source coupled to ground, said second NMOS drain providing said first bias voltage.

12. The sensing circuit as described in claim 9, further comprising a clamping circuit for restricting an output swing of said CMOS inverter amplifier, and comprising:
   a second PMOS transistor comprising a second PMOS source coupled to said mid node a second PMOS gate coupled to said first bias voltage and a second PMOS drain coupled to a second mid node;
   a second NMOS transistor comprising a second NMOS drain coupled to said second mid node, a second NMOS gate coupled to said second bias voltage, and a second NMOS source coupled to said mid node; and
   a second CMOS inverter amplifier of similar dimension and configuration as said CMOS inverter amplifier for reducing a gain of said CMOS inverter amplifier to restrict said output swing.

13. The sensing circuit as described in claim 12, wherein said second PMOS transistor is substantially larger than a third PMOS transistor in said resistive feedback circuit, and wherein said second NMOS transistor is substantially larger than a third PMOS transistor in said resistive feedback circuit.

14. The sensing circuit as described in claim 9, wherein said CMOS inverter amplifier is a first amplification stage, and further comprising:
   a second amplification stage comprising a second CMOS inverter amplifier coupled to said output, said second CMOS inverter amplifier of similar dimension and configuration as said CMOS inverter amplifier; and
   a third amplification stage comprising a third CMOS inverter amplifier coupled to said second CMOS inverter amplifier.

15. The sensing circuit as described in claim 9, wherein said resistive feedback circuit exhibits low parasitic capacitance to reduce effect on said input signal, and presents a high impedance at said input node to allow said CMOS inverter amplifier to amplify signals below 20 MHz.

16. The sensing circuit as described in claim 9, wherein said input signal is a capacitively coupled differential clock signal from a vernier structure.

17. The sensing circuit as described in claim 9, wherein said threshold voltage is one half of a supply voltage $V_{dd}$ that is supplied to said CMOS inverter amplifier.

18. A method for cancelling offset voltage in a sensing circuit comprising:
   a) amplifying an input signal to said sensing circuit with a CMOS inverter amplifier;
   b) biasing said CMOS inverter amplifier to a threshold voltage associated with said CMOS inverter amplifier to cancel an offset voltage associated with said CMOS inverter amplifier;
   c) maintaining a high input impedance at said input signal to amplify low frequency signals up to 20 MHz by operating MOSFET transistors of a resistive feedback circuit in a MOSFET subthreshold conduction region; and
   d) clamping an output swing of an output signal of said CMOS inverter amplifier to maintain said high input impedance.

19. The method as described in claim 18, further comprising:
   performing a second amplification by amplifying said output signal with a second CMOS inverter amplifier substantially similar in dimension and configuration as said CMOS inverter amplifier.

20. The method as described in claim 19, further comprising:
   performing a third stage amplification by amplifying a second output signal from said second CMOS inverter amplifier to bring said second output signal up to a full swing digital output voltage for frequencies below 1 MHz of said input signal.

21. The method as described in claim 18, wherein b) further comprises feeding said output signal of said CMOS inverter amplifier through said resistive feedback circuit and back to said input node.

22. The method as described in claim 18, wherein c) further comprises:
   c1) closely replicating said CMOS inverter amplifier in a bias circuit comprising a PMOS transistor and an NMOS transistor; and
   c2) coupling an NMOS diode in series to said PMOS transistor and said NMOS transistor for providing a first bias voltage from said PMOS transistor to said resistive feedback circuit that is slightly below said threshold voltage, and for providing a second bias voltage from said NMOS transistor to said resistive feedback circuit that is slightly above said threshold voltage.

23. The method as described in claim 22, wherein said PMOS transistor is slightly smaller than a second PMOS transistor in said CMOS inverter amplifier; and
   wherein said NMOS transistor is slightly larger than a second NMOS transistor in said CMOS inverter amplifier.

24. The method as described in claim 18, wherein d) further comprises:
   restricting said output swing by coupling a PMOS and NMOS switch transistors that are substantially larger than MOSFET transistors in said resistive feedback circuit, and switching said PMOS and NMOS switch transistors on when said output voltage swings too high; and
   coupling a second CMOS inverter amplifier to said PMOS and NMOS switch transistors to attenuate gain from said CMOS inverter amplifier when said PMOS and NMOS switch transistors are turned on.

25. A vernier alignment structure comprising a receiver comprising a plurality of sensing circuits, each for generating an alignment signal, and comprising:
   a CMOS inverter amplifier coupled to an input node, said CMOS inverter amplifier for amplifying an input signal;

a resistive feedback circuit coupled to said CMOS inverter amplifier and for cancelling an offset voltage associated with said CMOS inverter amplifier; and a bias circuit coupled to said resistive feedback circuit and for biasing said resistive feedback circuit in a minimally on state to maintain high impedance for said resistive feedback circuit.

26. The vernier alignment structure as described in claim 25, wherein said input signal is a capacitively coupled differential clock signal.

27. The vernier alignment structure as described in claim 26, wherein said differential clock signal is a 3.3 volt clock signal coupled through a minimum of 0.1 fF differential coupling capacitance and having a frequency of between 0–20 MHz.

28. The vernier alignment structure as described in claim 25, wherein said resistive feedback circuit biases said CMOS inverter amplifier to a threshold voltage associated with said CMOS inverter amplifier to cancel said offset voltage.

29. The vernier alignment structure as described in claim 25, wherein said resistive feedback circuit comprises:

a PMOS transistor comprising a PMOS source coupled to an output of said CMOS inverter amplifier that provides said output signal, a PMOS gate, and a PMOS drain coupled to said input node; and an NMOS transistor comprising an NMOS drain coupled to said PMOS source, an NMOS gate, and an NMOS source coupled to said output.

30. The vernier alignment structure as described in claim 25, wherein said bias circuit comprises:

a second CMOS inverter amplifier of similar dimension to said CMOS inverter amplifier, said second CMOS inverter amplifier comprising a PMOS transistor and an NMOS transistor in a standard inverter configuration; and an NMOS diode coupled in series between said PMOS transistor and said NMOS transistor, said NMOS diode for providing a p-bias voltage from said PMOS transistor to said resistive feedback circuit that is slightly lower than a threshold voltage associated with said CMOS inverter amplifier, and an n-bias voltage from said NMOS transistor that is slightly higher than said threshold voltage.

31. The vernier alignment structure as described in claim 25, further comprising a clamping circuit coupled to said resistive feedback circuit for restricting output swing of an output signal of said CMOS inverter amplifier to maintain said high impedance.

32. The vernier alignment structure as described in claim 31, wherein said clamping circuit comprises:

a PMOS transistor comprising a PMOS source coupled to an output of said CMOS inverter amplifier that provides said output signal, a PMOS gate coupled to a first bias voltage slightly lower than a threshold voltage of said CMOS inverter amplifier, and a PMOS drain coupled to a bias node;

said bias node;

an NMOS transistor comprising an NMOS drain coupled to bias node, an NMOS gate coupled to a second bias voltage slightly higher than said threshold voltage, and an NMOS source coupled to said output; and a second CMOS inverter amplifier of similar dimension to said CMOS inverter amplifier, and comprising a second input coupled to said bias node and a second output coupled to said bias node.

33. The sensing circuit as described in claim 25, wherein said CMOS inverter amplifier is a first amplification stage, and further comprising:

a second amplification stage comprising a second CMOS inverter amplifier coupled to said output, said second CMOS inverter amplifier of similar dimension and configuration as said CMOS inverter amplifier; and a third amplification stage comprising a third CMOS inverter amplifier coupled to said second CMOS inverter amplifier.

* * * * *